US008306550B2

(12) United States Patent
Sadek (10) Patent No.: US 8,306,550 B2
(45) Date of Patent: Nov. 6, 2012

(54) AUTOMATIC GAIN CONTROL IN RADIO FREQUENCY RECEIVERS

(75) Inventor: Ahmed K. Sadek, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 62 days.

(21) Appl. No.: 12/941,762

(22) Filed: Nov. 8, 2010

(65) Prior Publication Data

US 2011/0176644 A1 Jul. 21, 2011

Related U.S. Application Data

(60) Provisional application No. 61/297,106, filed on Jan. 21, 2010, provisional application No. 61/308,381, filed on Feb. 26, 2010.

(51) Int. Cl.
*H04W 72/00* (2009.01)
*H04K 3/00* (2006.01)

(52) U.S. Cl. ................... 455/454; 455/67.11; 455/234.1

(58) Field of Classification Search ............... 455/67.11, 455/67.13, 232.1–234.2, 237.1, 450, 454
See application file for complete search history.

(56) References Cited

U.S. PATENT DOCUMENTS

| | | | |
|---|---|---|---|
| 6,212,244 B1 | 4/2001 | Davidovici et al. | |
| 2004/0142696 A1 | 7/2004 | Saunders et al. | |
| 2006/0067354 A1 | 3/2006 | Waltho et al. | |
| 2007/0082639 A1 | 4/2007 | Lindstrom et al. | |

FOREIGN PATENT DOCUMENTS

| | | |
|---|---|---|
| WO | WO2007053196 A1 | 5/2007 |
| WO | 2008153553 A1 | 12/2008 |
| WO | 2009011688 A1 | 1/2009 |

OTHER PUBLICATIONS

Ham, Jeong et al., "Efficient Cooperative Channel Sensing in Cognitive Radio Ad Hoc Networks", 2008 IEEE, 5 pages.
Cabric, D. et al., "Implementation Issues in Spectrum Sensing for Cognitive Radios", Conference Record of the Thirty-Eighth Asilomar Conference on Signals, Systems and Computers, Nov. 2004, pp. 772-776 vol. 1, XP-010781056.
International Search Report and Written Opinion—PCT/US2011/022057—ISA/EPO—Apr. 14, 2011.

*Primary Examiner* — Lee Nguyen
(74) *Attorney, Agent, or Firm* — Jeffrey D. Jacobs (57) ABSTRACT

An automatic gain controller (AGC) in white space devices is configured with two operational modes. When entering a quiet time of the white space device, the AGC selects the first operational mode. The first operational mode is associated with detecting licensed signals on one or more white space channels by testing a measured received signal strength indicator (RSSI) value to determine which one of a number of the AGC's gain states should be used corresponding to a gain for application to input white space signals on the whitespace channels. When not in the quiet time, the AGC enters a second operational mode. The second operational mode sets a fixed gain state of the AGC's multiple gain states to apply in selecting one of the white space channels on which no licensed signals were detected.

16 Claims, 7 Drawing Sheets

AUTOMATIC GAIN CONTROL IN RADIO FREQUENCY RECEIVERS

CROSS REFERENCE TO RELATED APPLICATIONS

This application claims the benefit of U.S. provisional patent application Nos. 61/297,106 filed Jan. 21, 2010, to SADEK; and 61/308,381 filed Feb. 26, 2010, to SADEK, the disclosures of which are expressly incorporated by reference herein in their entireties.

TECHNICAL FIELD

The present disclosure relates, in general, to wireless communication systems, and, more particularly, to automatic gain control (AGC) in radio frequency (RF) receivers.

BACKGROUND

Radio frequency (RF) receivers receive a broad spectrum of input signals from the receiver antenna. In the process of selecting the signals of interest from the input spectrum, the incoming RF signals are typically filtered through a bandpass filter to narrow the frequency of input signals to be processed by the receiver. A automatic gain control (AGC) is used in conjunction with a low noise amplifier (LNA) on the front end of the RF receiver to select the appropriate gain for the LNA to apply to condition or equalize the incoming signal gain and assist in placing the incoming signal into the appropriate linear region for signal conversion by the receiver. Because the input signal strength can vary greatly over the input frequency, AGC is an adaptable system that uses feedback signals to locate the appropriate gain level for the LNA to apply.

RF receivers are used in many different aspects of wireless communications, from cellular mobile communications to short-ranged WiFi systems. Another RF system with receivers that would use AGC is are television (TV) white space devices. The Federal Communications Committee (FCC) is an independent agency of the United States government that is charged with regulating all non-federal government use of the radio spectrum (including radio and TV broadcasting), and all interstate telecommunications (wire, satellite and cable) as well as all international communications that originate or terminate in the United States. In 2008, the FCC issued rules approving the unlicensed signal operation in the unused TV channels (i.e., white space). However, this approved, unlicensed use is subject to protections set in place for the primary users of the TV band. The primary users of the TV band are Advanced Television System Committee (ATSC)/National Television System Committee (NTSC) transmitters, such as TV broadcasters, and licensed wireless microphones. The new rules allow wireless technologies to use the TV white space as long as the technology and any resulting signal transmissions do not interfere with the existing primary users. For purposes of this disclosure, the various devices that utilize such technologies to access this TV white space will be referred to as "white space devices," "unlicensed devices," or the like.

White space devices generally operate in a cognitive manner in which the devices first scan to detect TV band signals from licensed primary users. The white space devices will then select unused channels in order to avoid interference with the licensed signals. Therefore, these white space devices generally share two common functions: (1) sensing for ATSC/NTSC signals; and (2) selecting appropriate channels for interference avoidance. These two functions have different sets of requirements. For example, in performing signal sensing, the FCC dictates that the white space devices should be capable of detecting the non-bursty licensed signals at levels as low as −114 dBm. TV band signals can actually be very strong—at levels as high as −30 dBm. In contrast, for the channel selection functionality, the device will select channels having the minimum interference levels in the presence of bursty interference. Additionally, these white space devices may not consider selecting channels having a received signal strength indication (RSSI) level that exceeds some designated interference threshold. Thus, having such differing functional requirements, design of white space devices can be demanding.

BRIEF SUMMARY

Automatic gain control (AGC) is an adaptive system found in many electronic devices. The average output signal level is fed back to adjust the gain to an appropriate level for a range of input signal levels. In operation, the AGC goes through a training period in which the appropriate gain level is located for control of the associated LNA. The AGC has a number of states which correspond to a particular gain for the LNA to apply. During this training period, the AGC selects the state, which corresponds to the gain level, and then communicates that gain level to the LNA for application to the incoming signals. In various aspects of an AGC configured according to the present disclosure, the AGC begins its training period at a lower gain state. A measurement of the RSSI is made and used to determine the next state to select in the training period. Depending on the relationship of the measured RSSI to a number of switching thresholds for the AGC, the AGC may select the next state as the state up to three states away from the currently selected state. By allowing the next state to be selected beyond simply one of the adjacent states, the training process may be reduced substantially.

When used in white space application, the design requirements of an AGC would be very complex in order to meet the dictated levels for signal sensing and channel selection, including use in both bursty and non-bursty signal processing situations and in situations both where the strength of the signal of interest is below noise level and the signal strength is very strong. Therefore, instead of designing the AGC to handle this complexity in a single mode, a two-mode ACG is suggested for white space devices. Various aspects of the present disclosure describe an AGC design that includes a first mode for sensing and a second mode for channel selection.

According to one aspect, a method of automatically controlling gain in a white space device includes entering a quiet time of the white space device. The method also includes responsive to entering the quiet time, selecting a first operational mode associated with detecting licensed signals on at least one white space channel. The first operational mode tests a measured received signal strength indicator (RSSI) value to determine which one of a set of gain states of an automatic gain controller (AGC) to use corresponding to a gain for application to input white space signals on the whitespace channel(s). The method further includes entering a second operational mode outside of the quiet time. The second operational mode sets a fixed gain state, of the set of gain states, to apply in selecting one of the white space channels on which no licensed signals were detected.

In another aspect, a system for automatically controlling gain in a white space device includes means for entering a quiet time of the white space device. The system also has means, executable responsive to execution of the means for entering the quiet time, for selecting a first operational mode associated with detecting licensed signals on at least one white space channel. The first operational mode includes means for testing a measured received signal strength indicator (RSSI) value to determine which one of a set of gain states of an automatic gain controller (AGC) to use corresponding to a gain for application to input white space signals on the whitespace channel(s). The system also has means for entering a second operational mode outside of the quiet time. The second operational mode sets a fixed gain state, of the set of gain states, to apply in selecting one of the white space channels on which no licensed signals were detected.

In yet another aspect, a computer program product has a computer-readable medium having program code recorded thereon. The program code includes program code to enter a quiet time of the white space device. The program code also includes program code, executable in response to entering the quiet time, to select a first operational mode associated with detecting licensed signals on at least one white space channel. The first operational mode has program code to test a measured received signal strength indicator (RSSI) value to determine which one of a set of gain states of an automatic gain control (AGC) to use corresponding to a gain for application to input white space signals on the whitespace channel(s). The program code also includes program code to enter a second operational mode outside of the quiet time. The second operational mode sets a fixed gain state, of the set of gain states, to apply in selecting one of the white space channels on which no licensed signals were detected.

In a further aspect, a white space device has a processor, a linear noise amplifier (LNA) coupled to the processor, a digital variable gain amplifier (DVGA) coupled to the LNA, and an automatic gain controller (AGC) coupled to the LNA and the DVGA. The AGC includes a first operational mode associated with detecting licensed signals on at least one white space channel. The first operational mode is configured to test a measured received signal strength indicator (RSSI) value to determine which one of a set of gain states to use corresponding to a gain for application by one of the LNA and the DVGA to input white space signals on the whitespace channel(s). The AGC also includes a second operational mode configured to set a fixed gain state, of the set of gain states, to apply in selecting one of the white space channels on which no licensed signals were detected.

The foregoing has outlined rather broadly the features and technical advantages of the present teachings in order that the detailed description that follows may be better understood. Additional features and advantages will be described hereinafter which form the subject of the claims. It should be appreciated by those skilled in the art that the conception and specific embodiments disclosed may be readily utilized as a basis for modifying or designing other structures for carrying out the same purposes of the present teachings. It should also be realized by those skilled in the art that such equivalent constructions do not depart from the technology of the teachings as set forth in the appended claims. The novel features which are believed to be characteristic of the teachings, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present teachings.

BRIEF DESCRIPTION OF THE DRAWINGS

For a more complete understanding of the present teachings, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
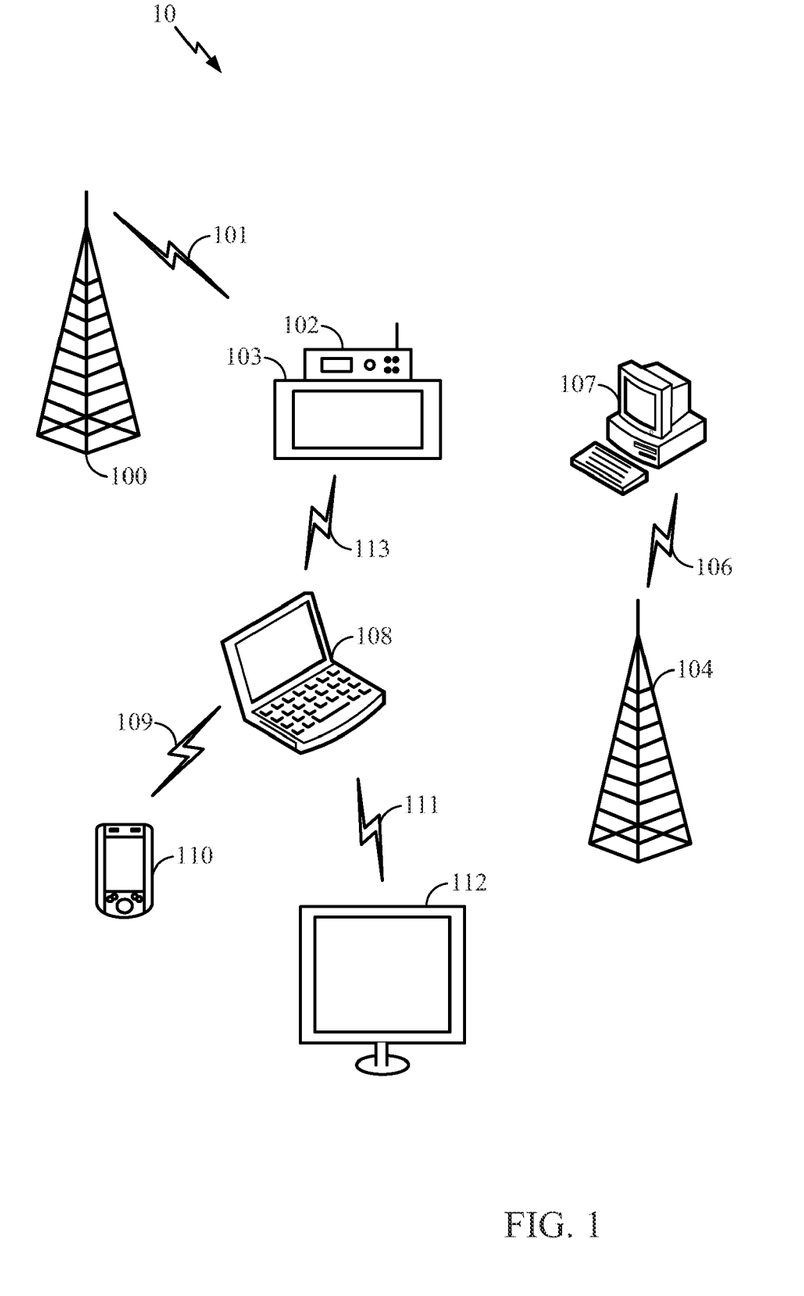
FIG. 1 is a block diagram illustrating a TV white space network configured according to one embodiment of the present teachings.

Turning now to FIG. 1, a block diagram is shown conceptually illustrating a TV white space network 10 configured according to one embodiment of the present teachings. Licensed ATSC signals originate from primary users, such as TV broadcasters and the like. The TV white space network 10 includes an ATSC transmitter 100 which transmits an ATSC signal 101. Many different devices may use such licensed ATSC signal 101, including a TV tuner 102, which includes a tuner and a signal decoder. The TV tuner 102 receives the licensed ATSC signal 101 and decodes the signals for display onto an associated television 103. Similarly, a licensed ATSC transmitter 104 transmits an ATSC signal 106 to a computer 107 for further processing. Each of the ATSC signals 101 and 106 is a licensed signal protected from interference by FCC regulations of various white space devices.

A laptop computer 108 is equipped with an ATSC signal detector and internal wireless antenna which configure the laptop computer 108 for wirelessly transmitting and receiving white space signals. The user of the laptop computer 108 has developed content that he or she intends to share over the TV white space network 10 with other white space or ATSC devices, such as the TV tuner 102 with the television 103, a mobile device 110, and a white space-compatible television 112. The laptop computer 108 begins by sensing the available ATSC spectrum in its vicinity. It detects the ATSC signal 101 and identifies this channel as off-limits for any unlicensed transmissions. The laptop computer 108 then generates white space signals 109, 111, and 113.

Because of the different sets of requirements for sensing ATSC/NTSC signals and interference avoiding channel selection, Automatic fgain controllers (AGCs) are used to provide a responsive control to the adaptive system of these white space devices. A two-mode AGC is suggested for white space devices in order to address these different requirements. Various aspects of the present disclosure describe an AGC design that includes a first mode for sensing and a second mode for channel selection.

Figure 2:
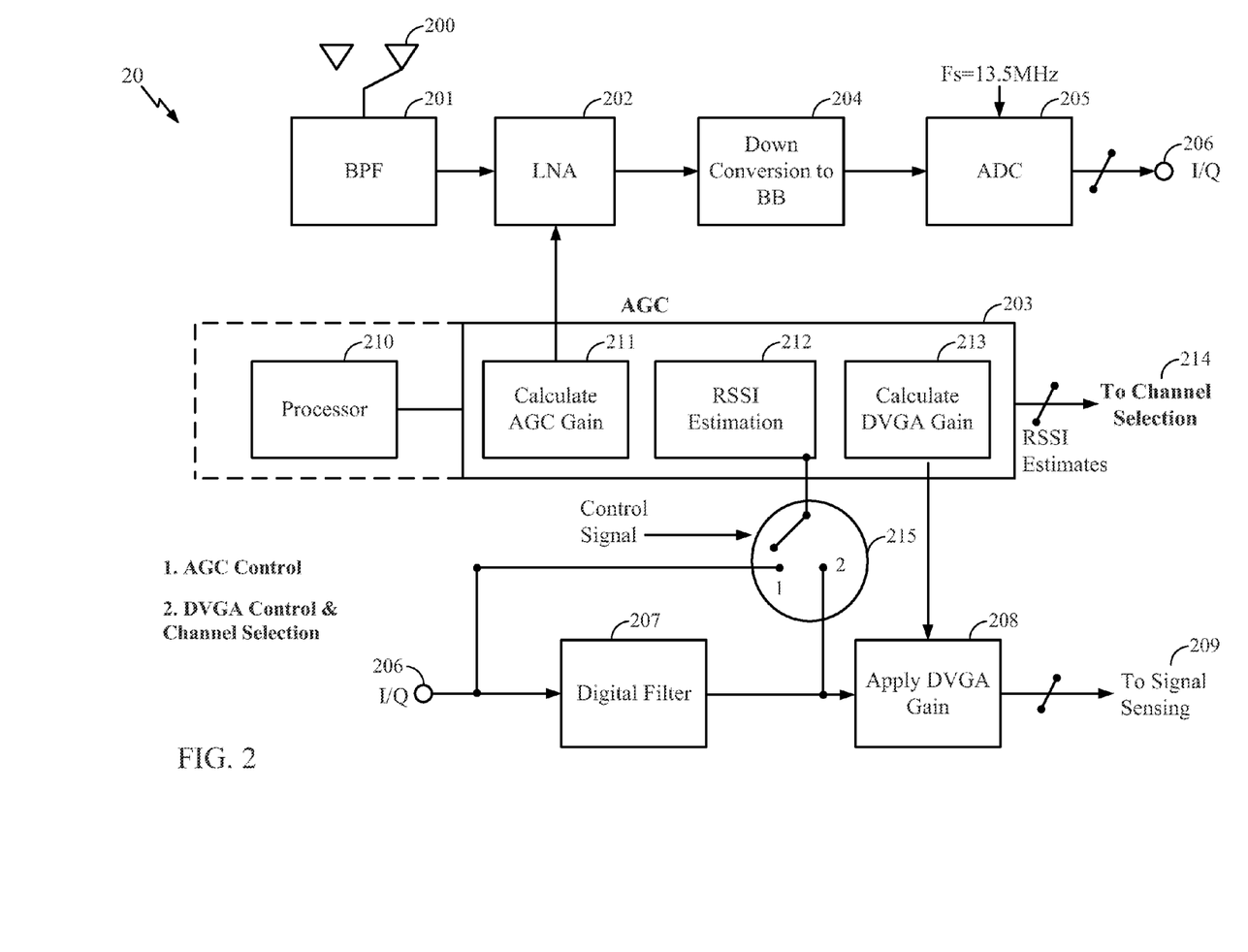
FIG. 2 is a block diagram conceptually illustrating a white space device configured according to one aspect of the present disclosure.

FIG. 2 is a block diagram conceptually illustrating a white space device 20 configured according to one aspect of the present disclosure. Signals enter the white space device 20 at an antenna 200. The signals are first processed at a band pass filter (BPF) 201 to block any signals beyond the frequency band of interest. The resulting input signals will be the received signals without the signal frequencies outside the band pass area of the BPF 201. A low noise amplifier (LNA) 202 conditions or amplifies the input signals to an appropriate level for processing. The LNA 202 is controlled by the AGC 203 before being converted to baseband (BB) at a downconverter 204. The input signal is then converted to digital at an analog to digital converter (ADC) 205. The digital input signal is then processed through an in-phase/quadrature (I/Q) section 206, in which the signal is modulated into an in-phase (I) and quadrature (Q) signal component.

The AGC 203 of the white space device 20 includes two operational modes. The first mode is used when the white space device 20 enters its signal sensing mode 209 during the quiet period. The second mode is used when the white space device 20 enters its channel selection mode 214. A switch 215 is used to switch the AGC 203 between its two operational modes. The AGC 203 includes an AGC gain calculation module 211, an RSSI estimation module 212, and a digital variable gain amplifier (DVGA) gain calculation module 213. The AGC 203 works in conjunction with a processor 210 in performing the various calculations and estimations made during operation. The AGC and DVGA controls 203 use a feedback of the I/Q digital input signals to calculate the AGC and DVGA gains by prompting the processor 210 to execute the AGC gain calculation module 211 and DVGA gain calculation module 213, respectively, and to estimate the RSSI, by prompting the processor to execute the RSSI estimation module 212. When the switch 215 is in the signal sensing position, the AGC 203 applies the RSSI estimations from the RSSI estimation module 212 to the unfiltered I/Q digital input signals. The DVGA gain is then calculated and communicated to the DVGA 208 for the signal sensing mode 209.

In the sensing mode 209 of one example, the white space device 20 quiets for 10 ms every 1 sec for sensing signals. Within that 10 ms, several different events occur before the AGC 203 can enter sensing time. First, the transmitter will ramp down at the beginning of the quiet period and then ramp back up at the end of the quiet period. The combination of ramp down and ramp up takes approximately 20 µs. Before sensing occurs, both the AGC 203 and the DVGA 208 in the digital processing section of the white space device 20 undergo training to accurately establish the correct RSSI level. During the sensing, the white space device 20 collects 64 k samples over 9.71 ms at 6.75 MHz. Ideally, the AGC training time should not encroach into the sensing time. As such, the AGC training time and DVGA training time should be less than 270 µs.

Figure 3:
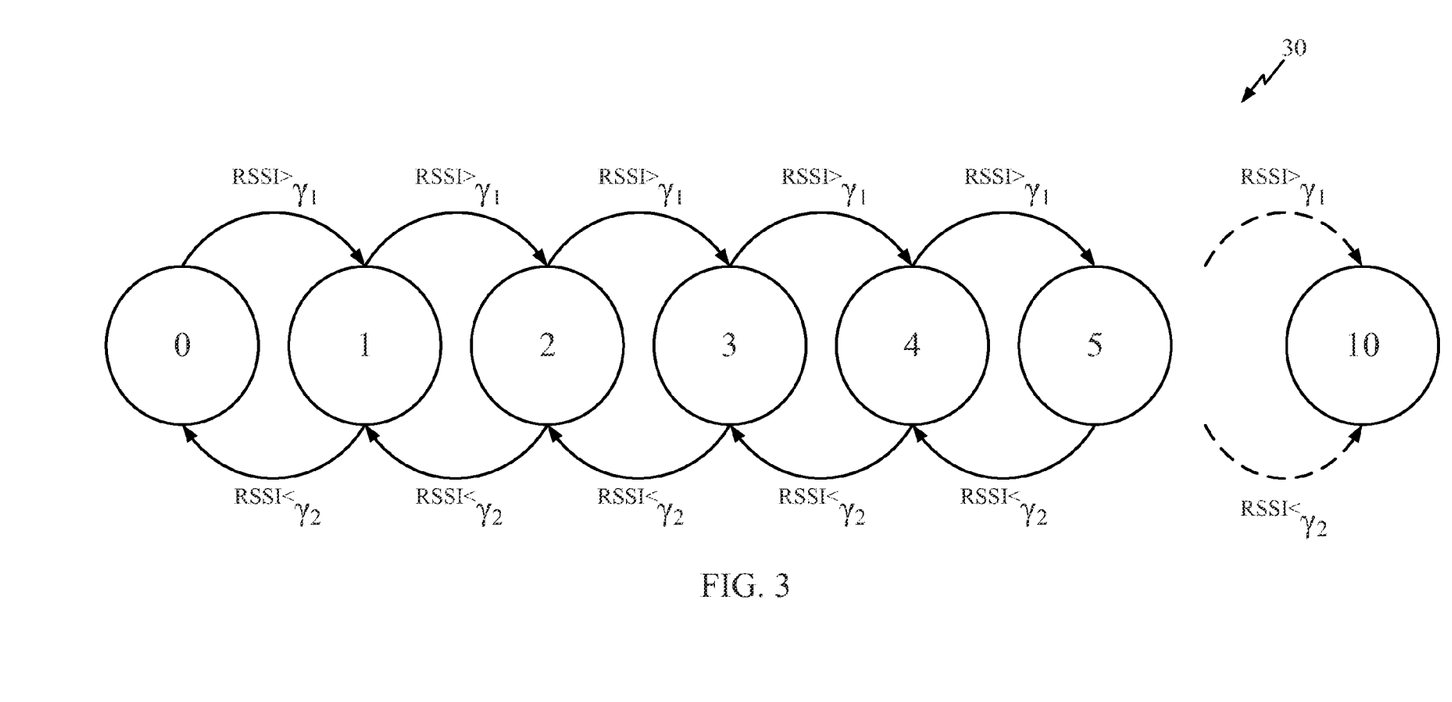
FIG. 3 is a state diagram conceptually illustrating a current AGC training algorithm.

Using current AGC training algorithms, the AGC training time may take up to 480 µs. FIG. 3 is a state diagram conceptually illustrating a current AGC training algorithm 30. The AGC searches and sets its gain to the appropriate set point. In many example AGC embodiments, there are 11 possible states that correspond to the possible RSSI/gain levels, although other numbers of states are also contemplated. For purposes of the example illustrated in FIG. 3, the AGC training algorithm 30 is shown having 11 possible states, labeled 0-10. In searching for the appropriate state, the AGC begins at the first state, state 0. An RSSI measurement is taken and compared against two of the AGC switching thresholds, $\gamma_1$ and $\gamma_2$. Depending on the result of the comparison, it will check each subsequent state until the appropriate state is found. At each state, the AGC uses approximately 48 µs, i.e., 38 µs to measure 256 samples used for the RSSI estimation at 6.75 MHz and then an additional 10 µs settling time. In the worst-case scenario, the AGC will make 10 measurement and compare iterations to go from state 0 all the way to state 10. Thus, the AGC will not converge for 480 µs (48 µs×10). With an additional 48 µs for training the DVGA, the total training time of 528 µs (480 µs+48 µs) greatly exceeds the ideal 270 µs to prevent encroachment into the sensing time.

Figure 4:
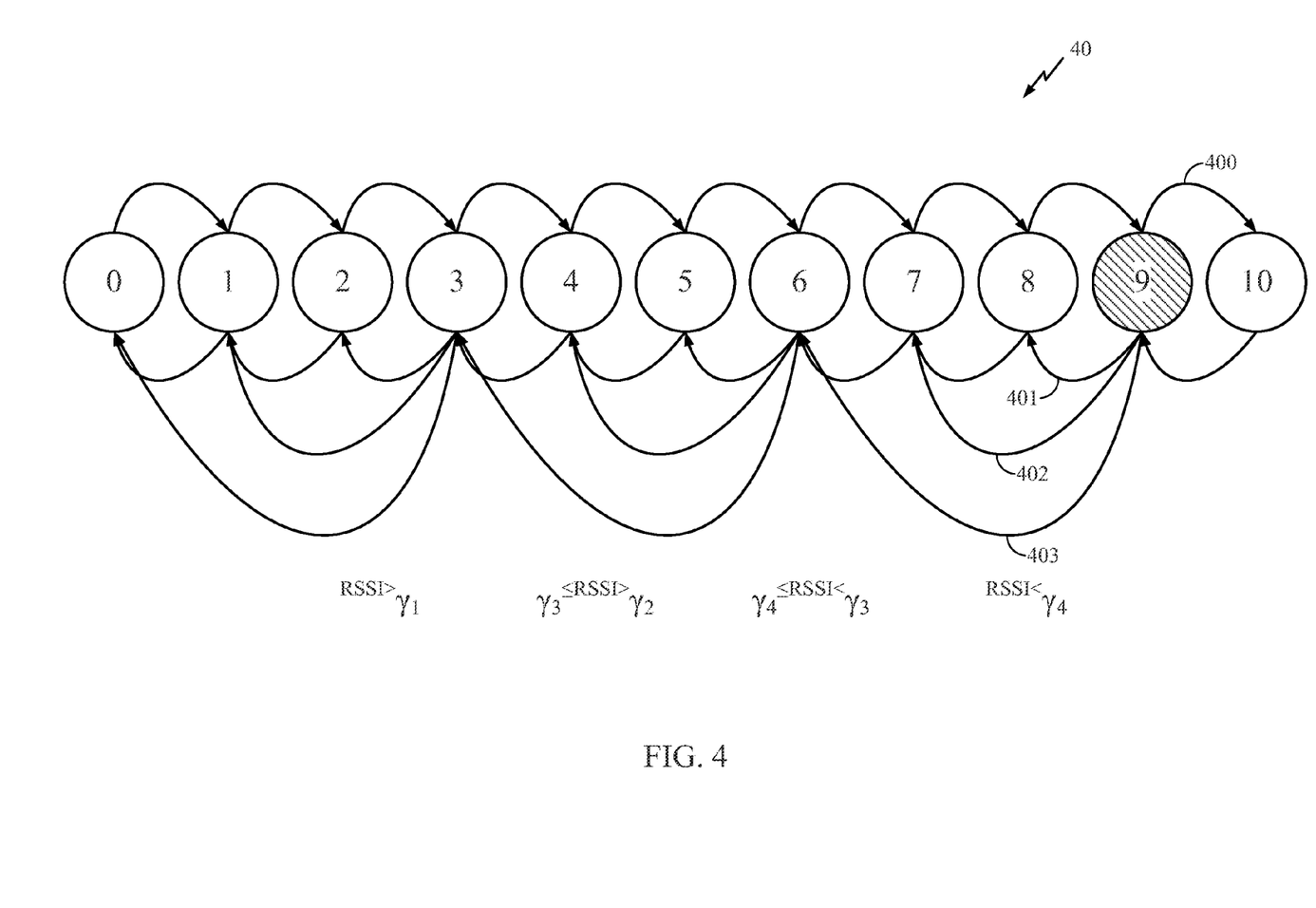
FIG. 4 is a state diagram conceptually illustrating an AGC training method configured according to one aspect of the present disclosure.

In various aspects of the present disclosure, the training convergence method is changed at the AGC. Instead of beginning at the first state, state 0, the new method begins at a higher state. FIG. 4 is a state diagram conceptually illustrating an AGC training method 40 configured according to one aspect of the present disclosure. The AGC training method 40 is illustrated having 11 possible gain states, just like the current AGC training method 30 in FIG. 3. However, instead of beginning the AGC training method 40 at state 0, the AGC training method 40 begins at a higher gain state, state 9. Additionally, instead of allowing only a single state-step, when the current state is found not to be the correct state, the AGC training method 40 allows for a jump of up to three gain states. The worst case scenario for the AGC training method 40 would arise when the correct state is state 0. The AGC will then progress from the beginning state, state 9, to state 0. However, because the AGC training method provides for state jumps of up to three gain states, convergence to the correct state, state 0, is guaranteed after only three cycles. Because each cycle still takes 48 µs, the AGC training method 40 can guarantee convergence in 144 µs.

Although the example is with respect to a 10 ms quieting period every second, of course the present disclosure contemplates other durations as well. Similarly, the times, number of samples, frequency, etc. throughout this description are merely non-limiting values.

In order to manage the variable-step training cycles, additional RSSI analysis is provided. RSSI analysis in both the current AGC training method 30 (FIG. 3) and the AGC training method 40 involves comparison of the RSSI against AGC gamma ($\gamma$) thresholds. The $\gamma$ thresholds are gain switching thresholds that depend on the particular phase of the state in the AGC. The $\gamma$ thresholds are associated with the particular AGC. In the current AGC training method 30 (FIG. 3), two $\gamma$ thresholds are used to compare against the measured RSSI. If the measured RSSI is greater than the first $\gamma$, the AGC steps up to the next state, while when the measured RSSI is less than the second $\gamma$, the AGC steps down to the previous state. In order to accommodate the variable step training cycles of the AGC training method 40, at least four $\gamma$ thresholds are used, $\gamma_1, \gamma_2, \gamma_3,$ and $\gamma_4$. Comparisons of the measured RSSI against each of the four $\gamma$ control which of the step sizes and directions to execute. Therefore, beginning at state 9, the AGC measures the RSSI and compares that against the four $\gamma$ (i.e., $RSSI > \gamma_1$; $\gamma_3 \leq RSSI < \gamma_2$; $\gamma_4 \leq RSSI < \gamma_3$; and $RSSI < \gamma_4$). Depending on which comparison formula is met, the AGC will select the step 400 up to state 10, the step 401 back to state 8, the step 402 back to state 7, or the step 403 back to state 6. Thus, in the worst case scenario, where the correct state is state 0, the AGC will converge on the correct state in 3 cycles. As each cycle lasts 48 µs, the entire AGC training time, including the DVGA training time, will be a maximum of 192

μs (i.e., 144 μs+48 μs), which is much less than the existing guaranteed time of 528 μs and also meets the desired maximum time limit of 270 μs.

It should be noted that in various aspects of the present disclosure different types of AGC may have different numbers of gain states. These various aspects are not, therefore, limited to AGCs with 11 gain states. 11 gain states have only been selected for illustration purposes.

Figure 5:
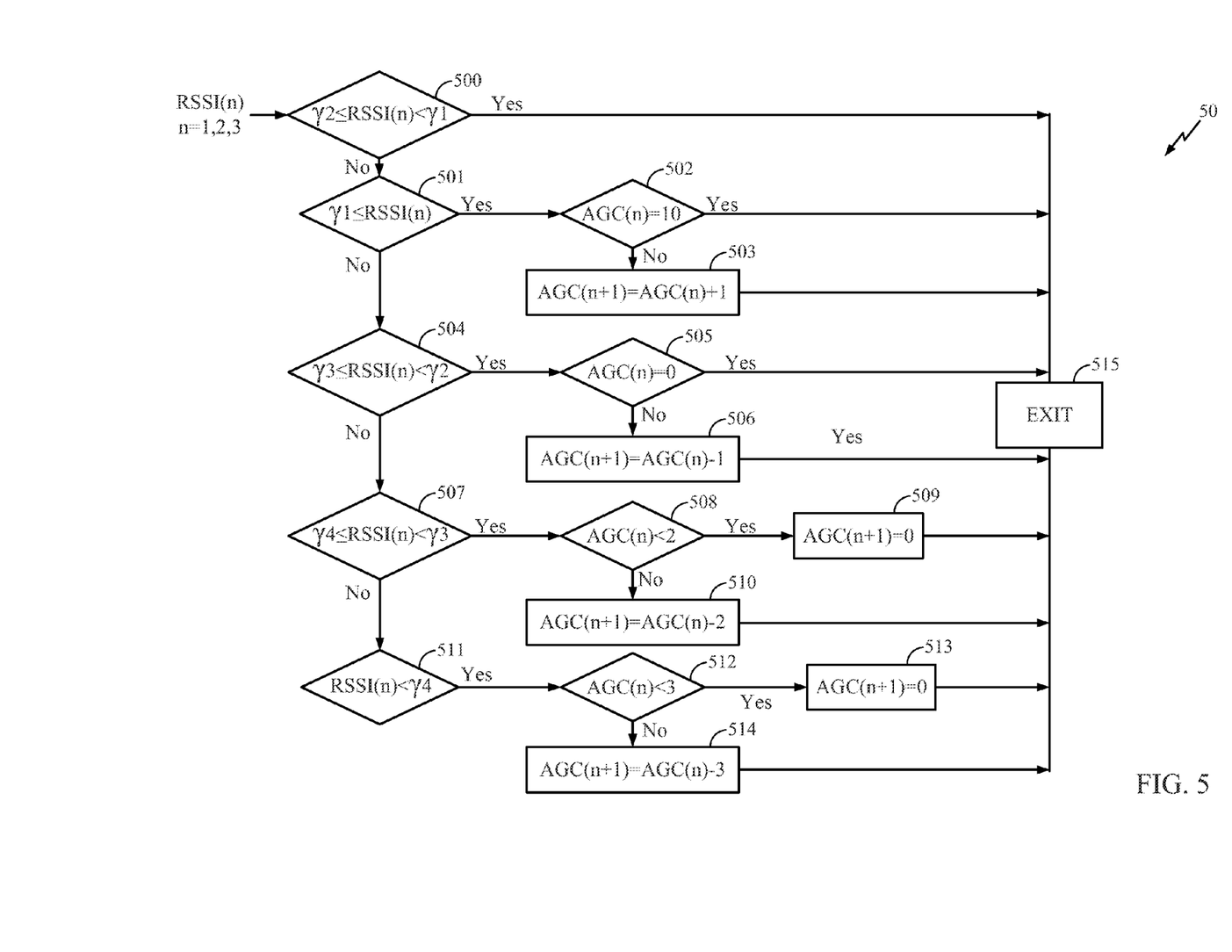
FIG. 5 is a functional block diagram conceptually illustrating example blocks executed to implement an AGC training method configured according to one aspect of the present disclosure.

FIG. 5 is a functional block diagram conceptually illustrating example blocks executed to implement an AGC training method 50 configured according to one aspect of the present disclosure. At block 500, a determination is made whether the RSSI measurement is between $\gamma_1$ and $\gamma_2$. If so, then the appropriate gain state is the current gain state, and this training iteration would then end at the exit block 515. If not, then a determination is made, in block 501, whether the RSSI measurement is greater than or equal to $\gamma_1$. If so, then, in block 502, a determination is made whether the current state is gain state 10. If the current state is gain state 10, then, this training iteration would end at the exit block 515. Otherwise, if the current gain state is not state 10, then, the next gain state is selected, in block 503, to be the current gain state plus 1, which selects the adjacent higher gain state. This training iteration would then end at exit block 515. If the RSSI is not greater than or equal to $\gamma_1$, then a determination is made, in block 504, whether the RSSI is between $\gamma_3$ and $\gamma_2$. If so, then another determination is made, in block 505, whether the current gain state is equal to state 0. If so, then this training iteration would end at the exit block 515. Otherwise, if the current gain state is not equal to state 0, then, in block 506, the next gain state will be the current gain state minus 1, which selects the adjacent lower gain state. This training iteration would then end at exit block 515. If the RSSI is not between $\gamma_3$ and $\gamma_2$, then a determination is made, in block 507, whether the RSSI is between $\gamma_4$ and $\gamma_3$. If so, then, in block 508, another determination is made whether the current gain level is less than state 2. If the current gain state is less than state 2, then, in block 509, the next gain state is gain state 0. This training iteration would then end at exit block 515. Otherwise, if the current gain state is not less than state 2, then, in block 510, the next gain state is selected to be the current gain state minus 2, which makes a jump of 2 gain states below the current gain state to select the next gain state. This training iteration would then end at exit block 515. If the RSSI is not between $\gamma_4$ and $\gamma_3$, then a determination is made, in block 511, whether the RSSI is less than $\gamma_4$. If so, then, in block 512, another determination is made whether the current gain state is less than state 3. If the current gain state is less than state 3, then, in block 513, the next gain state is selected to be state 0. This training iteration would then end at exit block 515. Otherwise, if the current gain state is not less than state 3, then, in block 514, the next gain state is selected to be the current gain state minus 3, which makes a jump of 3 gain states below the current gain state to select the next gain state. This training iteration would then end at exit block 515. The training iterations of the AGC training method 50 will then continue until the AGC converges on the correct gain state.

Prior to beginning the AGC training method 50, the AGC will first perform a coarse scan at startup of the white space device. This coarse scan will be performed during the first 30 seconds of the initial startup period. All of the channels will be coarsely scanned to find an RSSI level. The AGC will enter its sensing mode in order to find the RSSI level in each channel. The resulting 30 RSSI values will then be ranked by set point with the best values (e.g., the best 10 RSSI values) selected, such that the RSSI values will then be less than a certain set point (e.g., RSSI<−60 dBm).

Turning back to FIG. 2, when the switch 215 is in the channel selection mode 214, the I/Q digital input signals are filtered at a digital filter 207 with the digitally filtered signals being used by the RSSI estimation module 212 to estimate the RSSI for the channel selection mode 214. In the channel selection mode 214, the AGC 203 gain is fixed, such that the set point of the AGC 203 is at state 4, with the DVGA gain set to 0 dB gain. The time for the channel selection mode 214 is fixed at 110 ms.

It should be noted that in various aspects of the present disclosure, the filtered and unfiltered I/Q digital input signals may be downconverted prior to application of the RSSI estimation module 212 in either or both of the signal sensing mode 209 and the channel selection mode 214. Such aspects of the present disclosure would also includes downconverting hardware located prior to the AGC 203 input for application of the RSSI estimation module 212.

Figure 7:
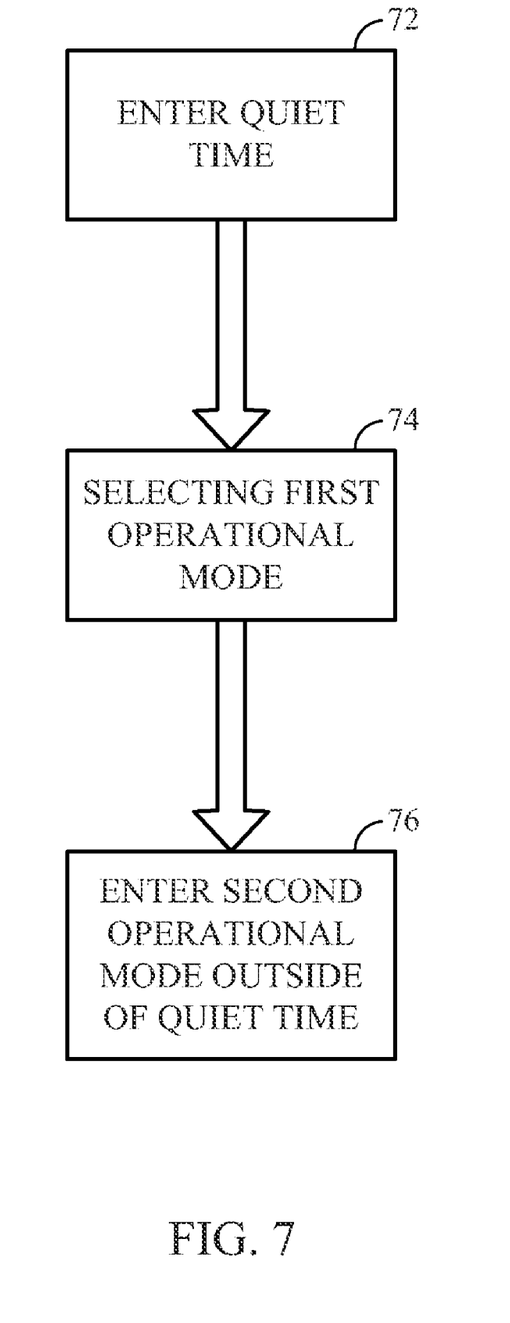
FIG. 7 is a functional block diagram conceptually illustrating example blocks executed to automatically control gain according to one aspect of the present disclosure.

Referring now to FIG. 7, a method for automatically controlling gain in a white space device is described. At block 72, a white space device enters a quiet time. At block 74, responsive to entering the quiet time, a first operational mode associated with detecting licensed signals on one or more white space channels is selected. The first operational mode tests a measured received signal strength indicator (RSSI) value to determine which gain state of an automatic gain control (AGC) to use corresponding to a gain for application to input white space signals on the whitespace channel(s). At block 76, the white space device enters a second operational mode outside of the quiet time. The second operational mode sets a fixed gain state to apply in selecting one of the white space channel(s) on which no licensed signals were detected.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Figure 6:
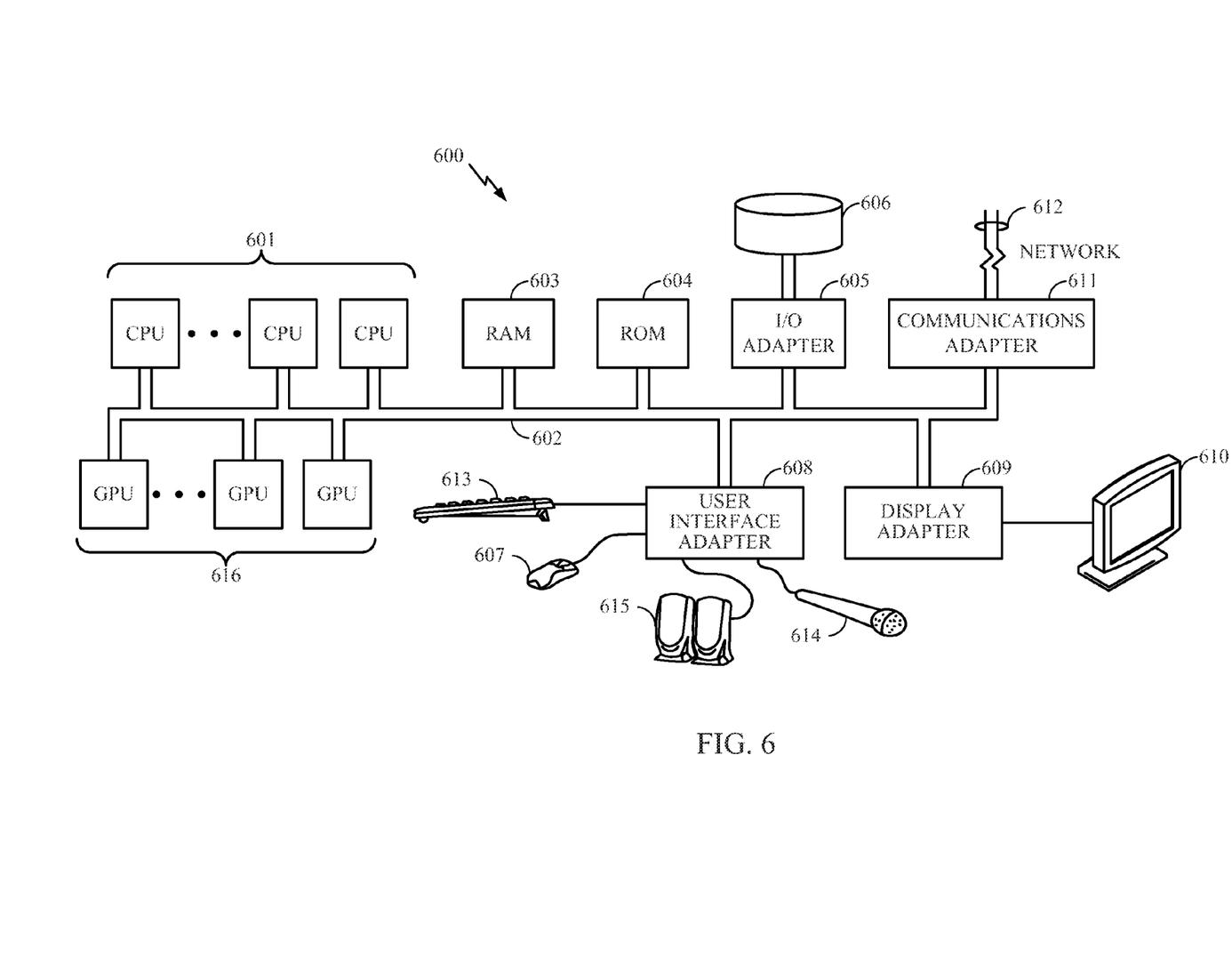
FIG. 6 illustrates an exemplary computer system which may be employed to implement any of the white space devices configured according to certain aspects of the present teachings.

FIG. 6 illustrates an exemplary computer system 600 which may be employed to implement any of the white space devices configured according to certain aspects of the present teachings. A central processing unit ("CPU" or "processor") 601 is coupled to a system bus 602. The CPU 601 may be any general-purpose processor. The present disclosure is not restricted by the architecture of the CPU 601 (or other components of the exemplary computer system 600) as long as the CPU 601 (and other components of the exemplary computer system 600) supports the operations as described herein. As such, the CPU 601 may provide processing to the exemplary computer system 600 through one or more processors or processor cores. The CPU 601 may execute the various logical instructions described herein. For example, the CPU 601 may execute machine-level instructions according to the exemplary operational flow described above in conjunction with FIG. 5. When executing instructions representative of the functionalities illustrated in FIG. 5, the CPU 601 becomes a special-purpose processor of a special purpose computing platform configured specifically to operate according to the various aspects of the teachings described herein.

The exemplary computer system 600 also includes random access memory (RAM) 603, which may be SRAM, DRAM, SDRAM, or the like. The exemplary computer system 600 includes read-only memory (ROM) 604 which may be PROM, EPROM, EEPROM, or the like. The RAM 603 and ROM 604 hold user and system data and programs, as is well known in the art.

The exemplary computer system 600 also includes an input/output (I/O) adapter 605, communications adapter 611, user interface adapter 608, and display adapter 609. The I/O adapter 605, user interface adapter 608, and/or the communications adapter 611 may, in certain aspects, enable a user to interact with the exemplary computer system 600 in order to input information.

The I/O adapter 605 couples a storage device(s) 606, such as one or more of a hard drive, compact disc (CD) drive, floppy disk drive, tape drive, etc., to the exemplary computer system 600. The storage devices 606 are utilized in addition to the RAM 603 for the memory requirements associated with performing the operations associated with the client and proxy multiradio devices and the network servers configured according to various aspects of the present teachings. The communications adapter 611 is adapted to couple the exemplary computer system 600 to a network 612, either directly or wirelessly, which may enable information to be input to and/or output from the exemplary computer system 600 via the network 612 (e.g., the Internet or other wide-area network, a local-area network, a public or private switched telephony network, a wireless network, or any combination of the foregoing). The communications adapter 611 may, therefore, be used to transmit or receive white space signals, when configured for wireless transmission. A user interface adapter 608 couples user input devices, such as a keyboard 613, a pointing device 607, and a microphone 614 and/or output devices, such as speaker(s) 615 to the exemplary computer system 600. The display adapter 609 is driven by the CPU 601 or by a graphical processing unit (GPU) 616 to control the display on a display device 610, for example, to display an incoming message or call on a client mobile device. A GPU 616 may be any various number of processors dedicated to graphics processing and, as illustrated, may be made up of one or more individual graphical processors. A GPU 616 processes the graphical instructions and transmits those instructions to a display adapter 609. The display adapter 609 further transmits those instructions for transforming or manipulating the state of the various numbers of pixels used by the display device 610 to visually present the desired information to a user. Such instructions include instructions for changing state from on to off, setting a particular color, intensity, duration, or the like. Each such instruction makes up the rendering instructions that control how and what is displayed on the display device 610.

It shall be appreciated that the present disclosure is not limited to the architecture of the exemplary computer system 600. For example, any suitable processor-based device may be utilized for implementing the cooperative operation of the multiradio devices, including without limitation personal computers, laptop computers, computer workstations, multi-processor servers, mobile telephones, and other such mobile devices. Moreover, certain aspects may be implemented on application specific integrated circuits (ASICs) or very large scale integrated (VLSI) circuits. In fact, persons of ordinary skill in the art may utilize any number of suitable structures capable of executing logical operations according to the aspects.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A method of automatically controlling gain in a white space device, the method comprising:
   entering a quiet time of the white space device;
   responsive to entering the quiet time, selecting a first operational mode associated with detecting licensed signals on at least one white space channel, the first operational mode testing a measured received signal strength indicator (RSSI) value to determine which one of a plurality of gain states of an automatic gain control (AGC) to use corresponding to a gain for application to input white space signals on the at least one whitespace channel; and entering a second operational mode outside of the quiet time, the second operational mode setting a fixed gain state of the plurality of gain states to apply in selecting one of the at least one white space channel on which no licensed signals were detected.

2. The method of claim 1 wherein the testing comprises:
measuring the RSSI value at a first gain state of the plurality of gain states associated with the AGC;
comparing the RSSI value against at least three threshold switching points associated with the AGC;
in response to the comparing, selecting one of a plurality of state-step values;
in response to the selected one corresponding to the first gain state, selecting the first gain state for the AGC; and
in response to the selected one not corresponding to the first gain state, shifting focus to a next state of the plurality of gain states, the next state being located at the selected one of the plurality of state-step values from the first gain state.

3. The method of claim 2 wherein the plurality of state-step values comprises:
the first gain state;
a next-higher gain state of the plurality of gain states;
a next-lower gain state of the plurality of gain states;
a second next-lower gain state of the plurality of gain states; and
a third next-lower gain state of the plurality of gain states.

4. The method of claim 2 wherein the first gain state is a second highest gain state of the plurality of gain states.

5. A system for automatically controlling gain in a white space device, the system comprising:
means for entering a quiet time of the white space device;
means, executable responsive to execution of the means for entering the quiet time, for selecting a first operational mode associated with detecting licensed signals on at least one white space channel, the first operational mode comprising:
means for testing a measured received signal strength indicator (RSSI) value to determine which one of a plurality of gain states of an automatic gain control (AGC) to use corresponding to a gain for application to input white space signals on the one or more whitespace channels; and
means for entering a second operational mode outside of the quiet time, the second operational mode setting a fixed gain state of the plurality of gain states to apply in selecting one of the at least one white space channel on which no licensed signals were detected.

6. The system of claim 5 wherein the means for testing comprises:
means for measuring the RSSI value at a first gain state of the plurality of gain states associated with the AGC;
means for comparing the RSSI value against at least three threshold switching points associated with the AGC;
means, executable in response to a result of the means for comparing, for selecting one of a plurality of state-step values;
means, executable in response to the selected one corresponding to the first gain state, for selecting the first gain state for the AGC; and
means, executable in response to the selected one not corresponding to the first gain state, for shifting focus to a next state of the plurality of gain states, the next state being located at the selected one of the plurality of state-step values from the first gain state.

7. The system of claim 6 wherein the plurality of state-step values comprises:
the first gain state;
a next-higher gain state of the plurality of gain states;
a next-lower gain state of the plurality of gain states;
a second next-lower gain state of the plurality of gain states; and
a third next-lower gain state of the plurality of gain states.

8. The system of claim 6 wherein the first gain state is a second highest gain state of the plurality of gain states.

9. A computer program product, comprising:
a computer-readable medium having program code recorded thereon, the program code comprising:
program code to enter a quiet time of the white space device;
program code, executable in response to entering the quiet time, to select a first operational mode associated with detecting licensed signals on at least one white space channel, the first operational mode comprising:
program code to test a measured received signal strength indicator (RSSI) value to determine which one of a plurality of gain states of an automatic gain control (AGC) to use corresponding to a gain for application to input white space signals on the at least one whitespace channel; and
program code to enter a second operational mode outside of the quiet time, the second operational mode automatically setting a fixed gain state of the plurality of gain states to apply in selecting one of the at least one white space channel on which no licensed signals were detected.

10. The computer program product of claim 9 wherein the program code to test comprises:
program code to measure the RSSI value at a first gain state of the plurality of gain states associated with the AGC;
program code to compare the RSSI value against at least three threshold switching points associated with the AGC;
program code, executable in response to execution of the program code to compare, to select one of a plurality of state-step values;
program code, executable in response to the selected one corresponding to the first gain state, to select the first gain state for the AGC; and
program code, executable in response to the selected one not corresponding to the first gain state, to shift focus to a next state of the plurality of gain states, the next state being located at the selected one of the plurality of state-step values from the first gain state.

11. The computer program product of claim 10 wherein the plurality of state-step values comprises:
the first gain state;
a next-higher gain state of the plurality of gain states;
a next-lower gain state of the plurality of gain states;
a second next-lower gain state of the plurality of gain states; and
a third next-lower gain state of the plurality of gain states.

12. The computer program product of claim 10 wherein the first gain state is a second highest gain state of the plurality of gain states.

13. A white space device comprising:
a processor;
a linear noise amplifier (LNA) coupled to the processor;
a digital variable gain amplifier (DVGA) coupled to the LNA; and
an automatic gain controller (AGC) coupled to the LNA and the DVGA, the AGC comprising:

a first operational mode associated with detecting licensed signals on at least one white space channel, the first operational mode configured to test a measured received signal strength indicator (RSSI) value to determine which one of a plurality of gain states to use corresponding to a gain for application by one of the LNA and the DVGA to input white space signals on the one or more whitespace channels; and a second operational mode configured to automatically set a fixed gain state of the plurality of gain states to apply in selecting one of the at least one white space channel on which no licensed signals were detected.

14. The white space device of claim 13 wherein the configuration of the first operational mode to test comprises configuration of the first operational mode:

to measure the RSSI value at a first gain state of the plurality of gain states associated with the AGC;

to compare the RSSI value against at least three threshold switching points associated with the AGC;

to select one of a plurality of state-step values in response to the comparing;

to select the first gain state for the AGC in response to the selected one corresponding to the first gain state; and to shift focus to a next state of the plurality of gain states in response to the selected one not corresponding to the first gain state, the next state being located at the selected one of the plurality of state-step values from the first gain state.

15. The white space device of claim 14 wherein the plurality of state-step values comprises:

the first gain state;

a next-higher gain state of the plurality of gain states;

a next-lower gain state of the plurality of gain states;

a second next-lower gain state of the plurality of gain states; and a third next-lower gain state of the plurality of gain states.

16. The white space device of claim 14 wherein the first gain state is a second highest gain state of the plurality of gain states.

* * * * *